(12) United States Patent
Nagatomo

(10) Patent No.: US 6,894,574 B2
(45) Date of Patent: May 17, 2005

(54) CR OSCILLATION CIRCUIT

(75) Inventor: Shigeru Nagatomo, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/392,820

(22) Filed: Mar. 21, 2003

(65) Prior Publication Data

US 2003/0184395 A1 Oct. 2, 2003

(30) Foreign Application Priority Data

Mar. 26, 2002 (JP) .................................... 2002-086155

(51) Int. Cl.$^7$ .............................................. H03B 5/20
(52) U.S. Cl. ..................... 331/135; 331/111; 331/143; 331/185
(58) Field of Search ................................ 331/111, 135, 331/143, 57, 185; 327/131, 132

(56) References Cited

U.S. PATENT DOCUMENTS 5,491,456 A * 2/1996 Kay et al. ..................... 331/57

* cited by examiner

Primary Examiner—Arnold Kinkead
(74) Attorney, Agent, or Firm—Rabin & Berdo, P.C.

(57) ABSTRACT

A CR oscillation circuit includes an oscillation unit having first through third invertion circuits connected in series between a first node and a second node, a capacitance element provided between the first node and an output terminal of the second inverting circuit, and a switch part for electrically connecting the first and second nodes according to a level of a control voltage; a constant current unit for allowing a constant current to flow according to a resistance value of an externally-provided resistive element to thereby supply a constant voltage; and a level conversion unit for converting a level of the constant voltage to thereby produce the control voltage.

7 Claims, 3 Drawing Sheets

CR OSCILLATION CIRCUIT

BACKGROUND OF THE INVENTION

1. Field of the Invention

The present invention relates to a CR oscillation circuit, and particularly to a CR oscillation circuit for controlling an oscillation frequency by an outside resistor.

This application is a counterpart of Japanese Patent Application, Serial Number 086155/2002, filed on Mar. 26, 2002, the subject matter of which is incorporated herein by reference.

2. Description of the Related Art

FIGS. 2(A) and 2(B) are respectively diagrams for describing a conventional outside resistor type CR oscillation circuit. FIG. 2(A) is a diagram showing a circuit configuration of the conventional CR oscillation circuit, and FIG. 2(B) is a diagram illustrating operation waveforms.

As shown in FIG. 2(A), the CR oscillation circuit has inverters 201, 202 and 203 connected in series between a node N1 and a node N3. A capacitor 204 is electrically connected both the node N1 and a node N2. The node N2 is electrically connected both the inverter 202 and the inverter 203. The node N1 is electrically connected to a terminal 205 for connecting one end of an outside resistor R1. The node N3 on the output side of the inverter 203 is electrically connected to a terminal 206 for connecting the other end of the outside resistor R1. An oscillation signal OUT is outputted from the node N3. Owing to the electrical connection of the outside resistor R between the terminals 205 and 206 in such a circuit, a feedback circuit is made up of the outside resistor R and the internal capacitor 204. Thus, an oscillation output OUT having a frequency corresponding to the time constant T of these elements is obtained.

The operation of the CR oscillation circuit will next be described.

Now assume that a source voltage is represented as VDD, threshold voltages of respective inverters are respectively represented as 0.5VDD, and "H" and "L" of input and output levels are respectively represented as VDD and 0 (=GND) for simplification of description. Further, the input impedance of each inverter is assumed to be infinite.

When power is turned on at a time t0 in FIG. 2(B), the capacitor 204 is discharged and a voltage V21 at the node N1 is assumed to be 0. Since the voltage level of the node N1 is outputted to the node N2 via the inverters 201 and 202, a voltage V22 at the node N2 results in 0. Further, since the voltage V22 at the node N2 is inverted by the inverter 203, a voltage V23 at the node N3 becomes VDD.

With power-on at the time t0, the capacitor 204 starts to charge via the outside resistor R. Thus, the voltage V21 at the node N1 exponentially rises from 0 to VDD according to the time constant T of the capacitor 204 and the outside resistor R.

When the voltage V21 reaches 0.5VDD at a time t1, the voltage inputted to the inverter 201 exceeds the threshold voltage thereof. Thus, the voltage outputted from the inverter 201 reaches 0 and the voltage V2 on the output side of the inverter 202 changes from 0 to VDD. Since, at this time, the voltage charged in the capacitor 204 is 0.5VDD, the voltage V21 at the node N1 reaches 1.5VDD. On the other hand, the voltage V23 at the node N3 on the output side of the inverter 203 results in 0. Correspondingly, the voltage V21 at the node N1 exponentially decreases from 1.5VDD to 0 according to the time constant T.

When the voltage V21 decreases to 0.5VDD at a time t2, the input voltage of the inverter 201 reaches less than or equal to its threshold voltage. Consequently, the output voltage of the inverter 201 becomes VDD and the voltage V22 on the output side of the inverter 202 changes from VDD to 0. Since, at this time, the voltage charged in the capacitor 204 is 0.5VDD, the voltage V21 at the node N1 results in −0.5VDD. On the other hand, the voltage V23 at the node N3 on the output side of the inverter 203 reaches VDD. Correspondingly, the voltage V21 at the node N1 exponentially rises from −0.5VDD to VDD according to the time constant T.

When the voltage V21 increases to 0.5VDD at a time t3, the input voltage of the inverter 201 exceeds its threshold voltage. Consequently, the output voltage of the inverter 201 becomes 0 and the voltage V22 on the output side of the inverter 202 changes from 0 to VDD. Since, at this time, the voltage charged in the capacitor 204 is 0.5VDD, the voltage V21 at the node N1 results in 1.5VDD. On the other hand, the voltage V23 at the node N3 on the output side of the inverter 203 reaches 0. Correspondingly, the voltage V21 at the node N1 exponentially decreases from 1.5VDD to 0 according to the time constant T.

With similar repetitive operations, the respective inverters are subsequently periodically inverted according to the time constant T set by the values of the capacitor 204 and the resistor R, and an oscillation signal OUT having a desired frequency is outputted from the node N3.

However, the conventional CR oscillation circuit involves the following problems.

Although the outside resistor R having a value corresponding to an intended oscillation frequency is electrically connected to the terminals 205 and 206, such parasitic capacitance Cp as indicated by each dotted line in FIG. 2(A) is contained in an actually-connected outside resistor R. The parasitic capacitance Cp greatly varies according to the state of packaging thereof. Also a problem arises in that since the value of the built-in capacitor 204 is relatively small, the influence of each parasitic capacitance Cp increases, thus causing errors in a value at a single test on the outside resistor and an oscillation frequency at its packaging.

SUMMARY OF THE INVENTION

A CR oscillation circuit according to the present invention includes an oscillation unit having first through third inversion circuits series-connected between a first node and a second node, a capacitance element provided between the first node and an output terminal of the second inverting circuit, and a switch part for electrically connecting the first and second nodes according to a level of a control voltage; a constant current unit for allowing a constant current to flow according to a resistance value of an externally-provided resistive element to thereby supply a constant voltage; and a level conversion unit for converting a level of the constant voltage to produce the control voltage.

The present invention provides a CR oscillation circuit which reduces an error produced in an oscillation frequency according to the state of packaging of an outside resistor.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
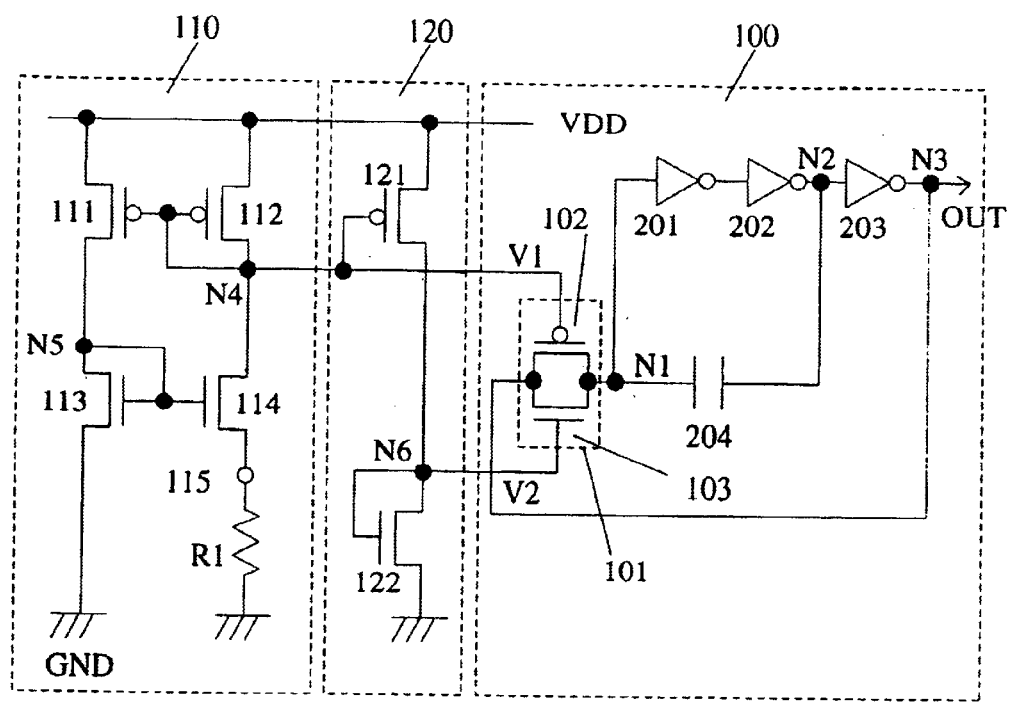
FIG. 1 is a circuit diagram showing a CR oscillation circuit according to an embodiment of the present invention.

FIG. 1 is a circuit diagram showing a CR oscillation circuit according to an embodiment of the present invention. The CR oscillation circuit according to the embodiment of the present invention comprises an oscillation unit 100, a constant current unit 110, and a level conversion unit 120.

The oscillation unit 100 comprises nodes N1, N2 and N3, inverters 201, 202 and 203, a capacitor 204, and a switch part 101. In the oscillation unit 100, the switch part 101 has four nodes and electrically connects the third and fourth nodes according to voltage levels applied to the first and second nodes. The node N1 is electrically connected to a fourth node of the switch part 101, an input terminal of the inverter 201, and one end of the capacitor 204. An output terminal of the inverter 201 is electrically connected to an input terminal of the inverter 202, and an output terminal of the inverter 202 is electrically connected to the node N2. The node N2 is electrically connected to an input terminal of the inverter 203 and the other end of the capacitor 204. An output terminal of the inverter 203 is electrically connected to the node N3. The node N3 is electrically connected to the third node of the switch part 101. The oscillation unit 100 outputs an oscillation signal OUT from the node N3.

Now, the switch part 101 is a transfer gate, which comprises a P channel MOS transistor (PMOS transistor) 102, and an N channel MOS transistor(NMOS transistor) 103. The PMOS transistor 102 has a gate electrode electrically connected to the first node of the switch part 101, a source electrode electrically connected to the third node, and a drain electrode electrically connected to the fourth node. The NMOS transistor 103 includes a gate electrode electrically connected to the second node of the switch part 101, a source electrode electrically connected to the third node, and a drain electrode electrically connected to the fourth node.

The constant current unit 110 comprises PMOS transistors 111 and 112 which constitute a current mirror, NMOS transistors 113 and 114 which constitute a current mirror, a terminal 115, an outside resistive element R1, and nodes N4 and N5. The constant current unit 110 is capable of controlling a current by the outside resistive element R1. The PMOS transistor 111 has a gate electrode electrically connected to a gate electrode of the PMOS transistor 112, a source electrode to which a source voltage VDD is applied, and a drain electrode electrically connected to the node N5. The PMOS transistor 112 has a gate electrode and a drain electrode electrically connected to the node N4, and a source electrode to which the source voltage VDD is applied. The NMOS transistor 113 has a gate electrode and a drain electrode electrically connected to the node N5, and a source electrode to which a ground voltage GND is applied. The NMOS transistor 114 has a gate electrode electrically connected to the gate electrode of the NMOS transistor 113, a source electrode electrically connected to the terminal 115, and a drain electrode electrically connected to the node N4. One end of the resistive element R1 is electrically connected to the terminal 115, whereas the other end thereof is electrically connected to the ground voltage GND.

Owing to the connection of the outside resistive element R1 between the terminal 115 and the ground voltage GND in such a constant current unit 110, a current that flows through the PMOS transistors 111 and 112 and NMOS transistors 113 and 114, is controlled to a constant value corresponding to the resistance value of the external resistive element R1. The constant current unit 110 outputs a constant voltage V1 corresponding to the constant current from the node N4.

The level conversion unit 120 comprises a node N6, a PMOS transistor 121, and an NMOS transistor 122. The PMOS transistor 121 has a gate electrode electrically connected to the node N4, a source electrode to which the source voltage VDD is applied, and a drain electrode electrically connected to the node N6. The NMOS transistor 122 has a gate electrode and a drain electrode electrically connected to the node N6, and a source electrode to which the ground voltage GND is applied. The level conversion unit 120 level-converts the voltage V1 at the node N4 and outputs a control voltage V2 from the node N6. The control voltage V2 is supplied to the gate electrode of the NMOS transistor 103 (or the second node of the switch part 101).

The operation of the CR oscillation circuit will be described.

When power is applied to the CR oscillation circuit, a constant current corresponding to the resistance value of the outside resistor R1 flows in the constant current unit 110. Thus, a constant voltage V1 corresponding to the constant current is outputted to the node N4 of the constant current unit 110.

The constant voltage V1 is supplied to the level conversion unit 120, where it is level-converted. The converted control voltage V2 is outputted from the node N6. The constant voltage V1 and the control voltage V2 are respectively supplied to the gates of the PMOS transistor 102 and NMOS transistor 103. Thus, each of the parallel-connected PMOS transistor 102 and NMOS transistor 103 assumes a constant conducting resistor corresponding to the outside resistor R1 and operate a feedback resistor with respect to the node N3 to the node N1.

Figure 2A:
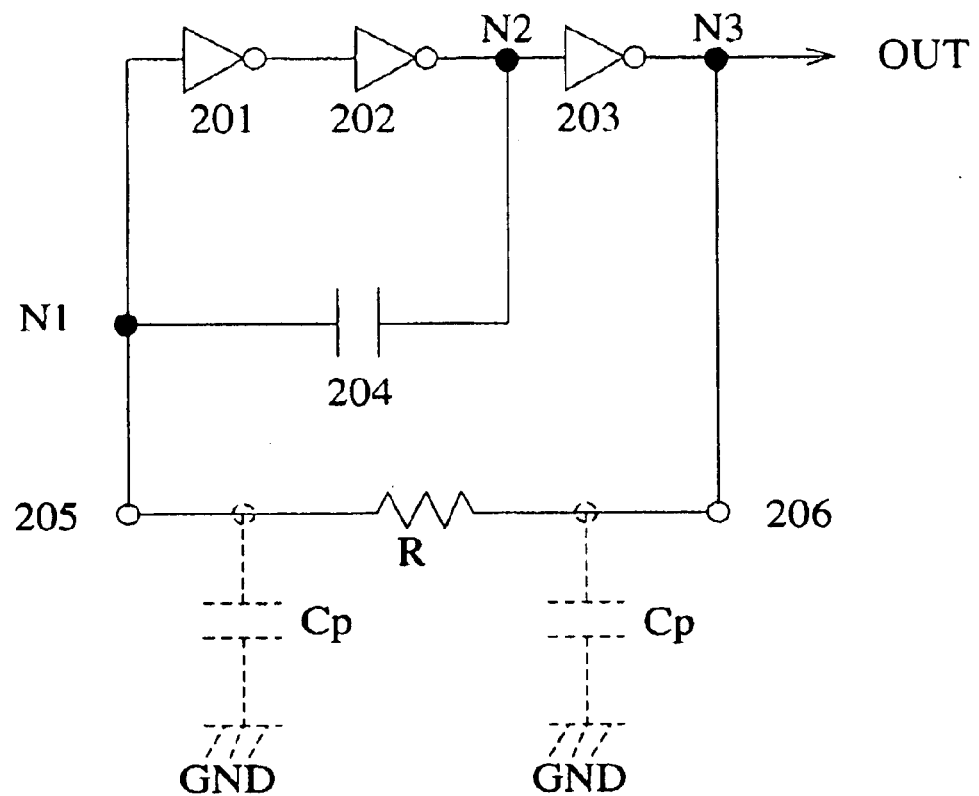
FIGS. 2A, B is a circuit diagram showing a conventional CR oscillation circuit and a timing chart thereof.
Figure 2B:
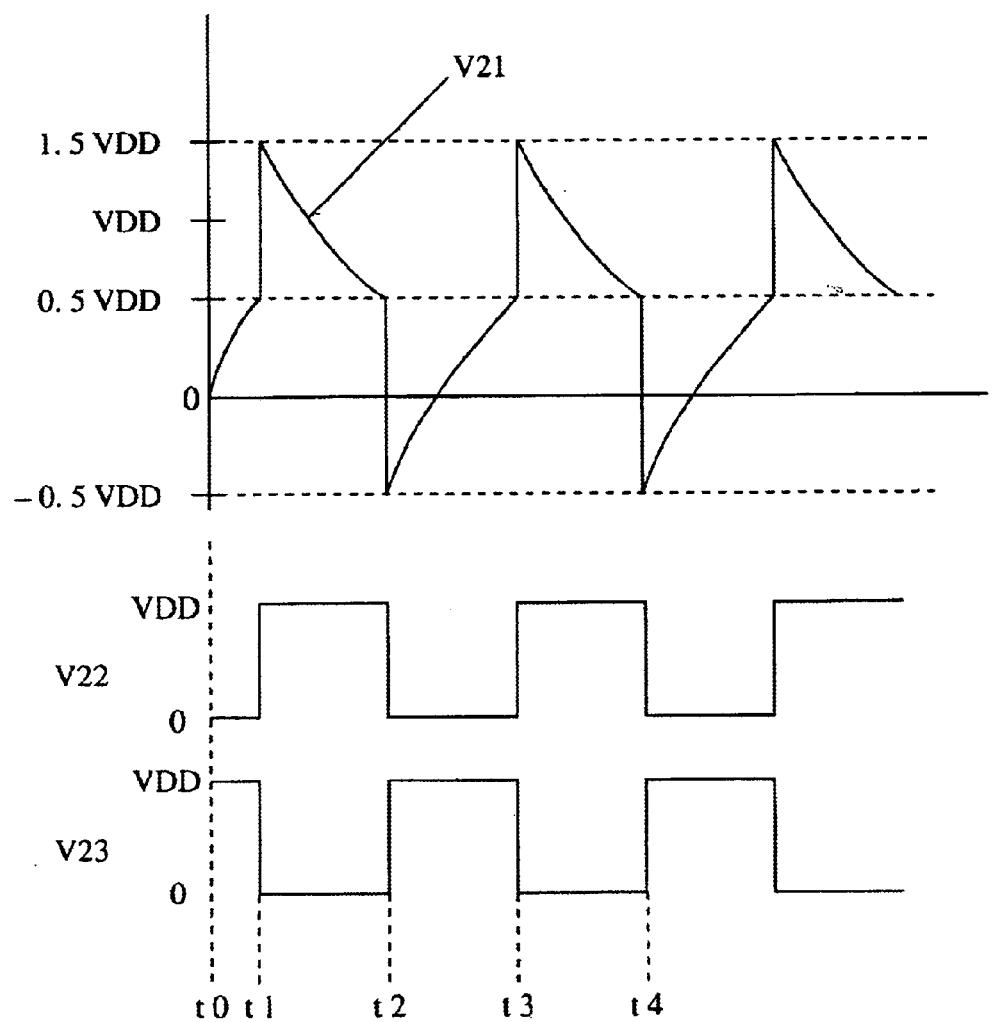

On the other hand, oscillating operations carried out by the inverters 201 through 203, the capacitor 204, and the PMOS transistor 102 and NMOS transistor 103 are represented as shown in FIG. 2(B).

Thus, the CR oscillation circuit according to the present embodiment has the PMOS transistor 102 and NMOS transistor 103 operated as the feedback resistor, the constant current unit 110 for controlling each of the conducting resistors for these PMOS transistor 102 and NMOS transistor 103 by means of the outside resistor R1, and the level conversion unit 120. A current that flows in the constant current unit 110, is not affected by the parasitic capacitance of the outside resistor R1. Accordingly, an advantageous effect is brought about in that a CR oscillation circuit free of the occurrence of an error in oscillation frequency according to the state of packaging of the outside resistor R1 is obtained. Also an advantageous effect is brought about in that since the PMOS transistor 102 and the NMOS transistor 103 are utilized in combination as a transfer gate type, currents charged into and discharged from the capacitor 204 can be set so as to flow freely in either direction, thereby making it possible to control the oscillation frequency accurately and reliably.

Incidentally, the present invention is not limited to the embodiment referred to above. Various modifications can be made thereto. For example, the following are mentioned as such modifications.

(a) The circuit configuration of the constant current unit 110 is not limited to the illustrated one. As an alternative to it, one may be used which causes a constant current to flow according to the value of the outside resistor R1 and outputs a constant voltage V1 corresponding to the constant current.

(b) The circuit configuration of the level conversion unit 120 is not limited to the illustrated one. As an alternative to it, one may be used which converts a constant voltage V1 outputted from the constant current unit 110 to a control voltage V2 for the NMOS transistor 103 and outputs it.

(c) A circuit configuration may be adopted in which the circuits for the constant current unit 110 and the level conversion unit 120 are changed so as to supply the constant voltage V1 of the constant current unit 110 to the NMOS transistor 103 and supply the control voltage V2 of the level conversion unit 120 to the PMOS transistor 102.

According to the present invention as described above in detail, a CR oscillation circuit has a feedback resistor using a conducting resistor for each transistor, a constant current circuit for controlling the conducting resistor according to the value of en outside resistor, and a level converting circuit. Consequently, an advantageous effect is obtained in that the CR oscillation circuit is not affected by parasitic capacitance of the outside resistor and produces no error in oscillation frequency according to the state of packaging.

According to the present invention, a first conductive type MOS transistor in which the value of a conducting resistor is controlled by a constant voltage, and a second conductive type MOS transistor in which the value of a conducting resistor is controlled by a control voltage, are connected in parallel as transistors according to the present invention. Consequently, an advantageous effect is obtained in that a more reliable operation can be performed.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A CR oscillation circuit, comprising:
    an oscillation unit which has first through third inverting circuits connected in series between a first node and a second node;
    a capacitance element provided between the first node and an output terminal of the second inverting circuit;
    a conducting resistor connected between the first node and the second node, the conducting resistor controlling a conducting resistance between the first node and the second node according to a level of a control voltage;
    a constant current unit which outputs a constant voltage by producing a constant current according to a resistance value of an outside resistive element; and
    a level conversion unit which converts a voltage level of the constant voltage and produces the control voltage.

2. The CR oscillation circuit according to claim 1, wherein the constant current unit comprises:
    a first current mirror circuit to which a first voltage is applied, and
    a second current mirror circuit which is connected to the first current mirror circuit via a third node and to which a second voltage is applied via the outside resistive element.

3. The CR oscillation circuit according to claim 2, wherein the first current mirror circuit comprises:
    a first P channel MOS transistor having a source electrode to which the first voltage is applied, and gate and drain electrodes connected to the third node, and
    a second P channel MOS transistor having a source electrode to which the first voltage is applied, and a gate electrode connected to the gate electrode of the first P channel MOS transistor, and
    wherein the second current mirror circuit comprises:
    a first N channel MOS transistor having a source electrode to which the second voltage is applied, a drain electrode connected to a drain electrode of the second P channel MOS transistor, and a gate electrode connected to the drain electrode thereof, and
    a second N channel MOS transistor having a source electrode to which the second voltage is applied via the resistive element, a drain electrode connected to the third node, and a gate electrode connected to the gate electrode of the first N channel MOS transistor.

4. The CR oscillation circuit according to claim 1, wherein the level conversion unit comprises:
    a third P channel MOS transistor having a source electrode to which the first voltage is applied, a gate electrode connected to the third node, and a drain electrode connected to a fourth node, and
    a third N channel MOS transistor having a source electrode to the second voltage is applied, and gate and drain electrodes connected to the fourth node.

5. The CR oscillation circuit according to claim 1, wherein conducting resistor comprises:
    a fourth P channel MOS transistor having a source electrode connected to the first node or the second node, a drain electrode connected to the second node or the first node, and a gate electrode to which the control voltage is applied, and
    a fourth N channel MOS transistor having a source electrode connected to the first node or the second node, a drain electrode connected to the second node or the first node, and a gate electrode to which the control voltage is applied.

6. A CR oscillation circuit, comprising:
    an amplifier circuit connected between a first node and second nodes, for outputting a signal of a low level to the second node when a potential of the first node is less than or equal to a threshold voltage, and outputting a signal of a high level when the potential thereof exceeds the threshold voltage;
    an inverting amplifier circuit for inverting a signal at the second node to thereby output an oscillation signal to a third node;
    a capacitor connected between the first and second nodes;
    transistors connected between the third and first nodes, said each transistor providing a conducting resistor having a value controlled by a control voltage;
    a constant current circuit for allowing a constant current corresponding to a value of resistor connected to the outside to flow to thereby output a constant voltage; and
    a level converting circuit for level-converting the constant voltage to produce the control voltage.

7. The CR oscillation circuit according to claim 6, wherein the transistors comprise a first conductive type MOS transistor whose conducting resistor has a value controlled by the constant voltage, and a second conductive type MOS transistor whose conducting resistor has a value controlled by the control voltage.

* * * * *